US012132460B1

(12) United States Patent
Durairaj

(10) Patent No.: US 12,132,460 B1
(45) Date of Patent: Oct. 29, 2024

(54) APPARATUS, SYSTEM, AND METHOD FOR CALIBRATING HIGH-SPEED COMMUNICATION INTERFACES TO TRANSMISSION LINES

(71) Applicant: Advanced Micro Devices, Inc., Santa Clara, CA (US)

(72) Inventor: Saravanakumar Durairaj, Bengaluru (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 246 days.

(21) Appl. No.: 17/855,538

(22) Filed: Jun. 30, 2022

(51) Int. Cl.
*H03H 11/28* (2006.01)
*G06F 13/40* (2006.01)

(52) U.S. Cl.
CPC ......... *H03H 11/28* (2013.01); *G06F 13/4068* (2013.01)

(58) Field of Classification Search
CPC ............................. H03H 11/28; G06F 13/4068
See application file for complete search history.

(56) References Cited

U.S. PATENT DOCUMENTS

| | | | | |
|---|---|---|---|---|
| 2013/0113517 A1* | 5/2013 | Ko | ...................... | H03K 19/0005 326/30 |
| 2016/0094202 A1* | 3/2016 | Hollis | .................. | G11C 29/028 327/109 |
| 2016/0365855 A1* | 12/2016 | Baek | .................. | H03K 19/0005 |
| 2017/0366169 A1* | 12/2017 | Baek | .................. | H03K 19/0005 |

* cited by examiner

*Primary Examiner* — David E Martinez
(74) *Attorney, Agent, or Firm* — Greenberg Traurig, LLP

(57) ABSTRACT

A computing device for calibrating high-speed communication interfaces to transmission lines may include an impedance-matching driver with a plurality of independently controllable impedance stages that facilitate matching an impedance of a transmission line. The computing device may also include a controller communicatively coupled to the impedance-matching driver via a plurality of control signals grouped into a first group of control signals that control a first stage included in the independently controllable impedance stages and a second group of control signals that control a second stage included in the independently controllable impedance stages. Various other apparatuses, systems, and methods are also disclosed.

20 Claims, 8 Drawing Sheets

Table 600

| Step Size | Zeq | 5X | 5X | 4X | 4X | 2X | 2X | 1X | 1X | Calibration Codes |
|---|---|---|---|---|---|---|---|---|---|---|
| 1.28 | 62.5 | 300 | 300 | 375 | 375 | 750 | 750 | 1500 | 1500 | 000,000,000,000 |
| 1.22 | 61.22 | 300 | 300 | 375 | 375 | 750 | 750 | 1200 | 1200 | 000,000,000,001 |
| 1.22 | 60 | 300 | 300 | 375 | 375 | 750 | 750 | 1000 | 1000 | 000,000,000,010 |
| 1.18 | 58.82 | 300 | 300 | 375 | 375 | 750 | 750 | 857.14 | 857.14 | 000,000,000,011 |
| 1.13 | 57.69 | 300 | 300 | 375 | 375 | 750 | 750 | 750 | 750 | 000,000,000,100 |
| 1.09 | 56.6 | 300 | 300 | 375 | 375 | 750 | 750 | 666.67 | 666.67 | 000,000,000,101 |
| 1.05 | 55.56 | 300 | 300 | 375 | 375 | 750 | 750 | 600 | 600 | 000,000,000,110 |
| 1.01 | 54.55 | 300 | 300 | 375 | 375 | 600 | 600 | 545.45 | 545.45 | 000,000,000,111 |
| 1.91 | 52.63 | 300 | 300 | 375 | 375 | 500 | 500 | 545.45 | 545.45 | 000,000,001,111 |
| 1.78 | 50.85 | 300 | 300 | 375 | 375 | 428.57 | 428.57 | 545.45 | 545.45 | 000,000,010,111 |
| 1.67 | 49.18 | 300 | 300 | 375 | 375 | 375 | 375 | 545.45 | 545.45 | 000,000,011,111 |
| 1.56 | 47.62 | 300 | 300 | 375 | 375 | 333.34 | 333.34 | 545.45 | 545.45 | 000,000,100,111 |
| 1.47 | 46.15 | 300 | 300 | 375 | 375 | 300 | 300 | 545.45 | 545.45 | 000,000,101,111 |
| 1.38 | 44.78 | 300 | 300 | 375 | 375 | 272.73 | 272.73 | 545.45 | 545.45 | 000,000,110,111 |
| 1.3 | 43.48 | 300 | 300 | 375 | 375 | 272.73 | 272.73 | 545.45 | 545.45 | 000,000,111,111 |
| 2.38 | 41.1 | 300 | 300 | 300 | 300 | 272.73 | 272.73 | 545.45 | 545.45 | 000,001,111,111 |
| 2.13 | 38.96 | 300 | 300 | 250 | 250 | 272.73 | 272.73 | 545.45 | 545.45 | 000,010,111,111 |
| 1.92 | 37.04 | 300 | 300 | 214.29 | 214.29 | 272.73 | 272.73 | 545.45 | 545.45 | 000,011,111,111 |
| 1.74 | 35.29 | 300 | 300 | 187.5 | 187.5 | 272.73 | 272.73 | 545.45 | 545.45 | 000,100,111,111 |
| 1.59 | 33.71 | 300 | 300 | 166.67 | 166.67 | 272.73 | 272.73 | 545.45 | 545.45 | 000,101,111,111 |
| 1.45 | 32.26 | 300 | 300 | 150 | 150 | 272.73 | 272.73 | 545.45 | 545.45 | 000,110,111,111 |
| 1.33 | 30.93 | 300 | 300 | 136.36 | 136.36 | 272.73 | 272.73 | 545.45 | 545.45 | 000,111,111,111 |
| 1.52 | 29.41 | 240 | 240 | 136.36 | 136.36 | 272.73 | 272.73 | 545.45 | 545.45 | 001,111,111,111 |
| 1.37 | 28.04 | 200 | 200 | 136.36 | 136.36 | 272.73 | 272.73 | 545.45 | 545.45 | 010,111,111,111 |
| 1.25 | 26.79 | 171.43 | 171.43 | 136.36 | 136.36 | 272.73 | 272.73 | 545.45 | 545.45 | 011,111,111,111 |
| 1.14 | 25.64 | 150 | 150 | 136.36 | 136.36 | 272.73 | 272.73 | 545.45 | 545.45 | 100,111,111,111 |
| 1.05 | 24.59 | 133.33 | 133.33 | 136.36 | 136.36 | 272.73 | 272.73 | 545.45 | 545.45 | 101,111,111,111 |
| 0.97 | 23.62 | 120 | 120 | 136.36 | 136.36 | 272.73 | 272.73 | 545.45 | 545.45 | 110,111,111,111 |
| 0.89 | 22.73 | 109.09 | 109.09 | 136.36 | 136.36 | 272.73 | 272.73 | 545.45 | 545.45 | 111,111,111,111 |

FIG. 6

APPARATUS, SYSTEM, AND METHOD FOR CALIBRATING HIGH-SPEED COMMUNICATION INTERFACES TO TRANSMISSION LINES

BACKGROUND

As computing technology advances, the speeds at which data is transferred from one device to another continue to increase. To perform at a high level and/or to comply with certain communication protocols or standards, the communication interfaces (e.g., transmitters and/or receivers) that support data transfer on these devices may need to be calibrated to the connecting transmission line. For example, a transmitting device may attempt to calibrate the impedance of its transmitter to match the impedance of a transmission line that connects the transmitter to a receiver. Additionally or alternatively, a receiving device may attempt to calibrate the impedance of its receiver to match the impedance of a transmission line that connects the receiver to a transmitter. By calibrating the impedance of the transmitter and/or receiver in this way, these devices may be able to reduce, mitigate, and/or eliminate disruptive signal reflections on the transmission line, thereby potentially improving the performance of the corresponding communication link.

As data-transfer speeds increase, the impact and/or severity of such signal reflections may become more detrimental to the performance of the corresponding communication link. In some cases, even slight mismatches between the impedances of the receiver or transmitter and the transmission line may impair the performance of the communication link or lead to its failure. Unfortunately, certain conventional calibration mechanisms may be unable to reliably match these impedances with the precision necessary to achieve optimal performance and/or comply with the corresponding communication protocols or standards, especially at high speeds.

The instant disclosure, therefore, identifies and addresses a need for additional and improved apparatuses, systems, and methods for calibrating high-speed communication interfaces to transmission lines.

SUMMARY

As will be described in greater detail below, the instant disclosure generally relates to apparatuses, systems, and methods for calibrating high-speed communication interfaces to transmission lines. In one example, a computing device for accomplishing such a task may include an impedance-matching driver that includes a plurality of independently controllable impedance stages that facilitate matching an impedance of a transmission line. In this example, the computing device may also include a controller communicatively coupled to the impedance-matching driver via a plurality of control signals grouped into a first group of control signals that control a first stage included in the independently controllable impedance stages and a second group of control signals that control a second stage included in the independently controllable impedance stages.

Similarly, a method for calibrating high-speed communication interfaces to transmission lines may include creating an impedance-matching driver that includes a plurality of independently controllable stages for matching an impedance of a transmission line. In one example, this method may also include communicatively coupling a controller to the impedance-matching driver via a plurality of control signals grouped into a first group of control signals that control a first stage included in the independently controllable impedance stages and a second group of control signals that control a second stage included in the independently controllable impedance stages.

In some examples, a non-transitory computer-readable medium comprising one or more computer-executable instructions that, when executed by at least one processor of a computing device, cause the computing device to generate a computer-readable representation of a circuit. In one example, this circuit may include an impedance-matching driver that includes a plurality of independently controllable impedance stages that facilitate matching an impedance of a transmission line. In this example, the circuit may also include a controller communicatively coupled to the impedance-matching driver via a plurality of control signals grouped into a first group of control signals that control a first stage included in the independently controllable impedance stages and a second group of control signals that control a second stage included in the independently controllable impedance stages.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 6 is an illustration of an exemplary table of values representative of configurable impedance levels applied by stages of an impedance-matching driver according to one or more embodiments of this disclosure.

Figure 1:
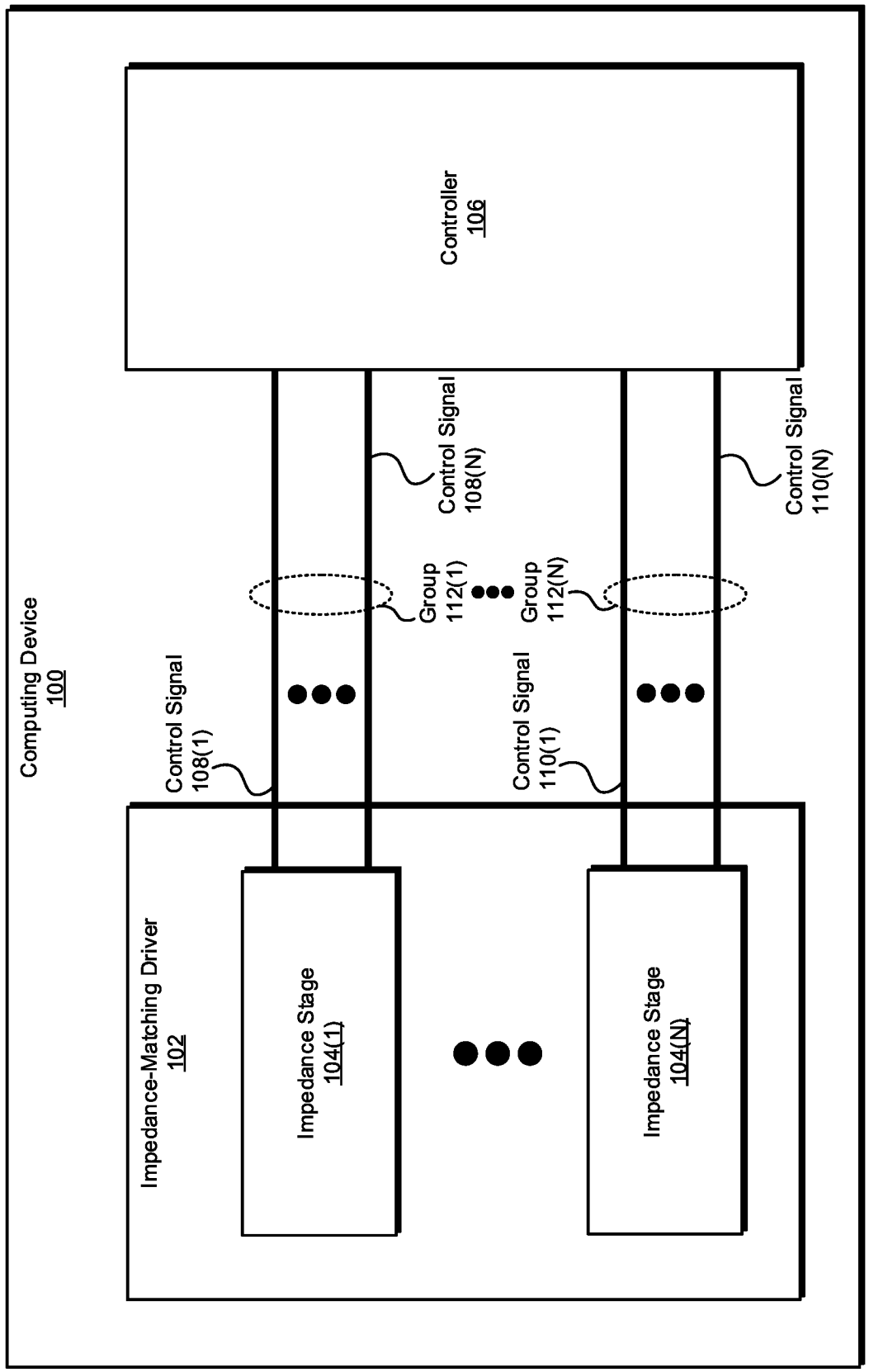
FIG. 1 is a block diagram of an exemplary computing device for calibrating high-speed communication interfaces to transmission lines according to one or more embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for calibrating high-speed communication interfaces to transmission lines. As will be explained in greater detail below, the various apparatuses, systems, and/or methods described herein may provide various benefits and/or advantages over certain traditional mechanisms for calibrating communication interfaces to transmission lines. For example, the various apparatuses, systems, and/or methods described herein may be able to increase and/or optimize the accuracy and/or precision of impedance-matching resolution or steps, thereby leading to better impedance matches between communication interfaces and transmission lines. As a result, the corresponding communication link may achieve better performance and/or comply with or satisfy the demands of the applicable communication protocol or standard-even at very high speeds.

As an example, the various apparatuses, systems, and/or methods described herein may calibrate an Input/Output (I/O) interface, a transmitter, and/or a receiver to comply with and/or satisfy the high-speed link standards of communication protocols like Peripheral Component Interconnect (PCI), Universal Serial Bus (USB), X Attachment Unit Interface (XAUI), and/or Mobile Industry Processor Interface (MIPI). These apparatuses, systems, and/or methods may be able to perform such calibration while avoiding some of the drawbacks and/or shortcomings that impair conventional calibration mechanisms. For example, to be able to calibrate a transmitter and/or receiver to a number of different communication standards and/or protocols at any given time, a calibration circuit may need to provide and/or support a wide impedance range. However, one conventional way of achieving wider impedance ranges may involve increasing the number of switches in the calibration circuit. Unfortunately, increasing the number of switches in the calibration circuit may lead to higher pad capacitances, which in turn reduce the speed at which data is reliably transferred via the corresponding communication link.

As another example, to widen the impedance range without increasing the pad capacitances, a calibration circuit may need to limit the number of switches that are configurable across multiple stages of an impedance-matching mechanism. However, limiting the number of switches in the calibration circuit may lead to lower resolution and/or greater step sizes for stepping across the impedance range during a calibration process and/or cycle. As a result, the calibration circuit may be unable to provide the accuracy and/or precision necessary to achieve a suitable impedance match between a transmitter or receiver and a transmission line that constitute and/or form part of a high-speed communication link.

To address these drawbacks and/or shortcomings, the various apparatuses, systems, and/or methods described herein may include and/or provide an impedance-matching driver that includes multiple independently controllable impedance stages. These impedance stages may facilitate and/or support matching the impedance of a transmission line. The various apparatuses, systems, and/or methods described herein may also include and/or provide a controller communicatively coupled to the impedance-matching driver via multiple control signals divided into various groups. In some examples, a first group of control signals may control a first stage included in the independently controllable impedance stages, and a second group of control signals may control a second stage included in the independently controllable impedance stages. By implementing an impedance-matching driver with multiple independently controllable stages in this way, these apparatuses, systems, and/or methods may be able to achieve and/or provide increased impedance-matching resolution and/or precision without sacrificing much, if any, impedance range or increasing pad capacitance. As a result, these apparatuses, systems, and/or methods may offer and/or afford circuits or devices for improving the performance and/or reliability of configurable multi-protocol high-speed communication links.

The following will provide, with reference to FIGS. 1-4, 6, and 7, detailed descriptions of exemplary apparatuses, systems, devices, implementations, and/or features for calibrating high-speed communication interfaces to transmission lines. Detailed descriptions of an exemplary method for calibrating high-speed communication interfaces to transmission lines will be provided in connection with FIGS. 5 and 8.

FIG. 1 shows an exemplary computing device 100 that facilitates calibrating high-speed communication interfaces to transmission lines. As illustrated in FIG. 1, computing device 100 may include and/or represent an impedance-matching driver 102 and a controller 106 communicatively coupled and/or connected to one another via groups 112(1)-(N) of control signals. In some examples, impedance-matching driver 102 may include and/or represent independently controllable impedance stages 104(1)-(N) that facilitate determining and/or matching the impedance of a transmission line communicatively coupled and/or connected to computing device 100. In such examples, impedance-matching driver 102 may enable computing device 100 to calibrate and/or impedance-match a high-speed communication interface (such as an I/O interface, a transmitter, a receiver, and/or a transceiver) to a corresponding transmission line (such as a cable, a cord, and/or a connector).

In some examples, groups 112(1)-(N) may each include and/or represent any number of control signals necessary to program and/or configure impedance stages 104(1)-(N). For example, group 112(1) may include and/or represent control signals 108(1)-(N) that control and/or configure impedance stage 104(1). In this example, group 112(N) may include and/or represent control signals 110(1)-(N) that control and/or configure impedance stage 104(N).

In some examples, impedance-matching driver 102 may include and/or represent a programmable and/or configurable weighted resistor ladder or network. In one example, each stage of impedance-matching driver 102 may provide and/or apply a certain amount of impedance used together to compare with and/or match to the impedance of the transmission line. When combined with one another, impedance stages 104(1)-(N) may provide, form, and/or generate an equivalent impedance that is compared, via a driver output (e.g., an output voltage), to a reference to determine whether impedance-matching driver 102 accurately matches the transmission line. In this example, controller 106 may increment and/or cycle through different signal code combinations on groups 112(1)-(N) until an accurate impedance match is detected by way of a comparison involving the driver output. Once an accurate impedance match is detected, controller 106 may record, save, and/or store the signal code combinations that were applied to groups 112(1)-(N) to render and/or generate the accurate impedance match.

In some examples, impedance-matching driver 102 may include and/or represent any type or form of variable impedance circuit, component, and/or feature. In one example, each of impedance stages 104(1)-(N) may include and/or represent any variety or combination of electrical and/or electronics components that facilitate incrementing, decrementing, and/or changing impedance or resistance levels. For example, impedance stages 104(1)-(N) may each include and/or represent one or more resistors, switches, and/or transistors arranged and/or configured to form or provide a programmable weighted resistor network and/or ladder. Additional examples of electrical and/or electronics components that may be included and/or represented in impedance-matching driver 102 include, without limitation, registers, memory devices, circuitry, transistors, resistors, capacitors, diodes, connections, inductors, traces, buses, semiconductor (e.g., silicon) devices and/or structures, processing devices, combinations or variations of one or more of the same, and/or any other suitable components.

In some examples, each of impedance stages 104(1)-(N) may be independently controllable, programmable, and/or configurable relative to one another. For example, the impedance applied and/or outputted by impedance stage 104(1) may be controlled and/or configured by group 112(1) of control signals 108(1)-(N) but may be unaffected and/or unchanged by group 112(N) of control signals 110(1)-(N). Conversely, the impedance applied and/or outputted by impedance stage 104(N) may be controlled and/or configured by group 112(N) of control signals 110(1)-(N) but may be unaffected and/or unchanged by group 112(1) of control signals 108(1)-(N).

In some examples, controller 106 may include and/or represent any type or form of hardware-implemented device capable of interpreting and/or executing computer-readable instructions. Examples of controller 106 include, without limitation, processors, central processing units (CPUs), microprocessors, microcontrollers, field-programmable gate arrays (FPGAs) that implement softcore processors, application-specific integrated circuits (ASICs), systems on a chip (SoCs), processing devices, portions of one or more of the same, variations or combinations of one or more of the same, and/or any other suitable controllers.

In some examples, controller 106 may include and/or represent a register-based algorithm and/or a shift-register circuit or device. Additionally or alternatively, controller 106 may include and/or represent a finite-state machine (FSM). In one example, the FSM may include and/or represent a storage device and/or a set of flip-flops. In this example, the storage device and/or set of flip-flops may include and/or represent registers that store the digital logic represented by groups 112(1)-(N) of control signals.

In some examples, computing device 100 may include and/or represent one or more semiconductor devices implemented and/or deployed as part of a circuit and/or a computing system. For example, computing device 100 may include and/or represent a processor, an ASIC, an FPGA, and/or an SoC. In another example, computing device 100 may include and/or represent a personal computer. Additional examples of computing device 100 include, without limitation, client devices, laptops, tablets, desktops, servers, cellular phones, Personal Digital Assistants (PDAs), multimedia players, embedded systems, wearable devices, gaming consoles, routers, switches, hubs, modems, bridges, repeaters, gateways, multiplexers, network adapters, network interfaces, circuits (e.g., integrated circuits), portions of one or more of the same, variations or combinations of one or more of the same, and/or any other suitable computing device.

In some examples, computing device 100 and/or controller 106 may implement and/or be configured with any of a variety of different architectures and/or microarchitectures. For example, computing device 100 and/or controller 106 may implement and/or be configured as a reduced instruction set computer (RISC) architecture. In another example, computing device 100 and/or controller 106 may implement and/or be configured as a complex instruction set computer (CISC) architecture. Additional examples of such architectures and/or microarchitectures include, without limitation, 16-bit computer architectures, 32-bit computer architectures, 64-bit computer architectures, x86 computer architectures, advanced RISC machine (ARM) architectures, microprocessor without interlocked pipelined stages (MIPS) architectures, scalable processor architectures (SPARCs), load-store architectures, portions of one or more of the same, combinations or variations of one or more of the same, and/or any other suitable architectures or microarchitectures.

Figure 2:
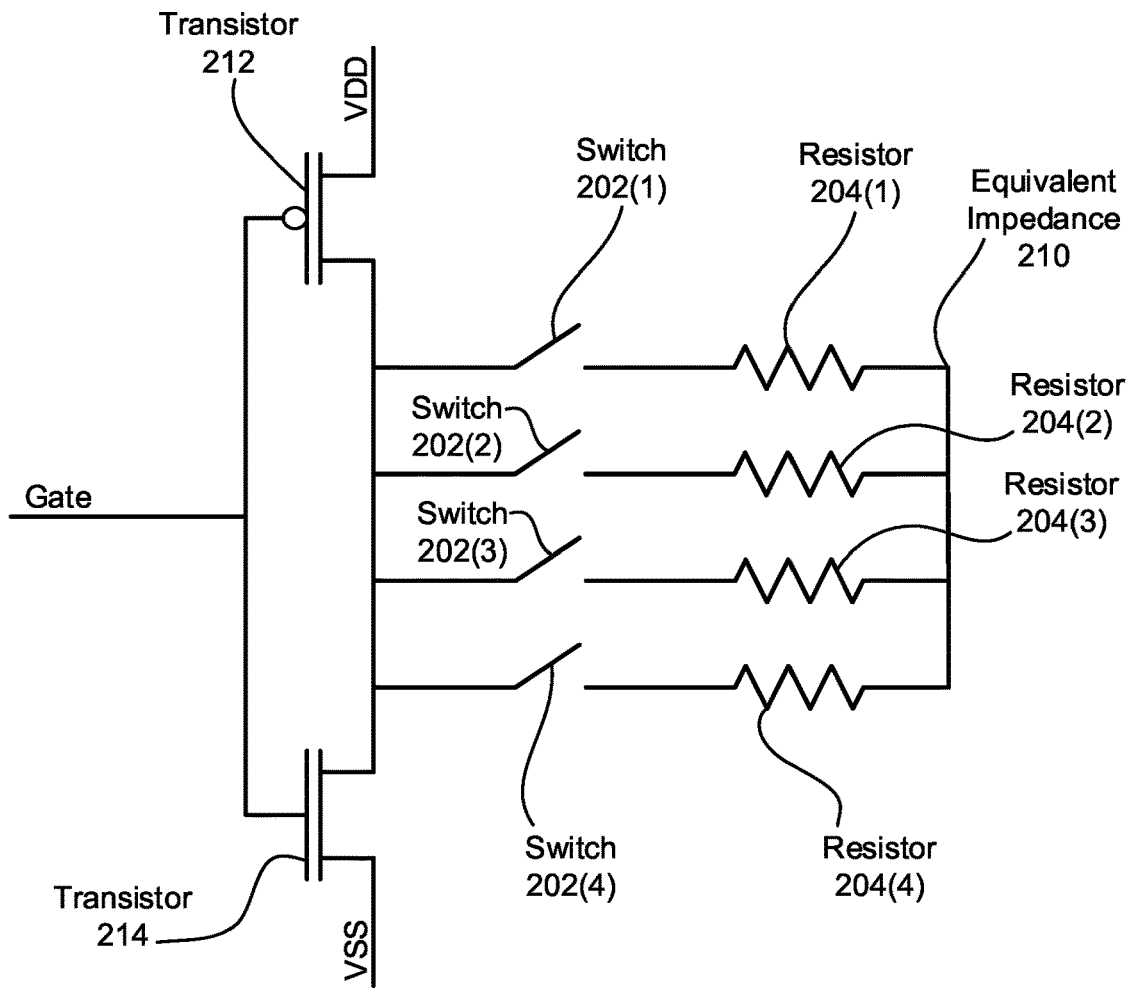
FIG. 2 is a schematic diagram of an exemplary impedance stage capable of applying configurable levels of impedance to a driver that facilitates matching the impedance of transmission lines according to one or more embodiments of this disclosure.

FIG. 2 shows an exemplary implementation of impedance stage 104(1) of impedance-matching driver 102. As illustrated in FIG. 2, impedance stage 104(1) may include a variety of components that facilitate incrementing, decrementing, and/or changing impedance or resistance levels within impedance-matching driver 102. For example, impedance stage 104(1) may each include and/or represent a set of resistors 204(1), 204(2), 204(3), and 204(4) arranged and/or configured in parallel with one another. In this example, impedance stage 104(1) may also include a set of switches 202(1), 202(2), 202(3), and 202(4) arranged and/or configured in series with resistors 204(1)-(4), respectively.

In some examples, impedance stage 104(1) may represent and/or be implemented as a current mode driver and/or a voltage mode driver. In one example, such a current mode driver and/or voltage mode driver may facilitate and/or support differential signaling via complementary and/or inverted signaling patterns, protocols, and/or standards (e.g., USB, PCI, XAUI, MIPI, etc.) In certain implementations, impedance stage 104(1) may include and/or represent transistors 212 and 214. In one example, transistor 212 may be configured and/or applied as a p-channel metal-oxide semiconductor (PMOS) transistor, and transistor 214 may be configured and/or applied as an n-channel metal-oxide semiconductor (NMOS) transistor. Additionally or alternatively, transistors 212 and 214 may be configured and/or applied as a complementary metal-oxide semiconductor (CMOS) implementation.

In some examples, the source of transistor 212 may be electrically coupled and/or applied to a voltage source (e.g., VDD), and the source of transistor 214 may be electrically coupled and/or applied to ground (e.g., VSS). In one example, the gate on impedance stage 104(1) may constitute and/or represent an input for signaling data and/or state changes through those of resistors 204(1)-(4) that have been enabled and/or activated via switches 202(1)-(4). In this example, the drain of transistor 212 and the drain of transistor 214 may be electrically coupled to one another at a node. Additionally or alternatively, switches 202(1)-(4) may be electrically coupled between that node and resistors 204(1)-(4), respectively. Resistors 204(1)-(N) may be electrically coupled at another node that constitutes and/or represents an equivalent impedance 210.

Figure 3:
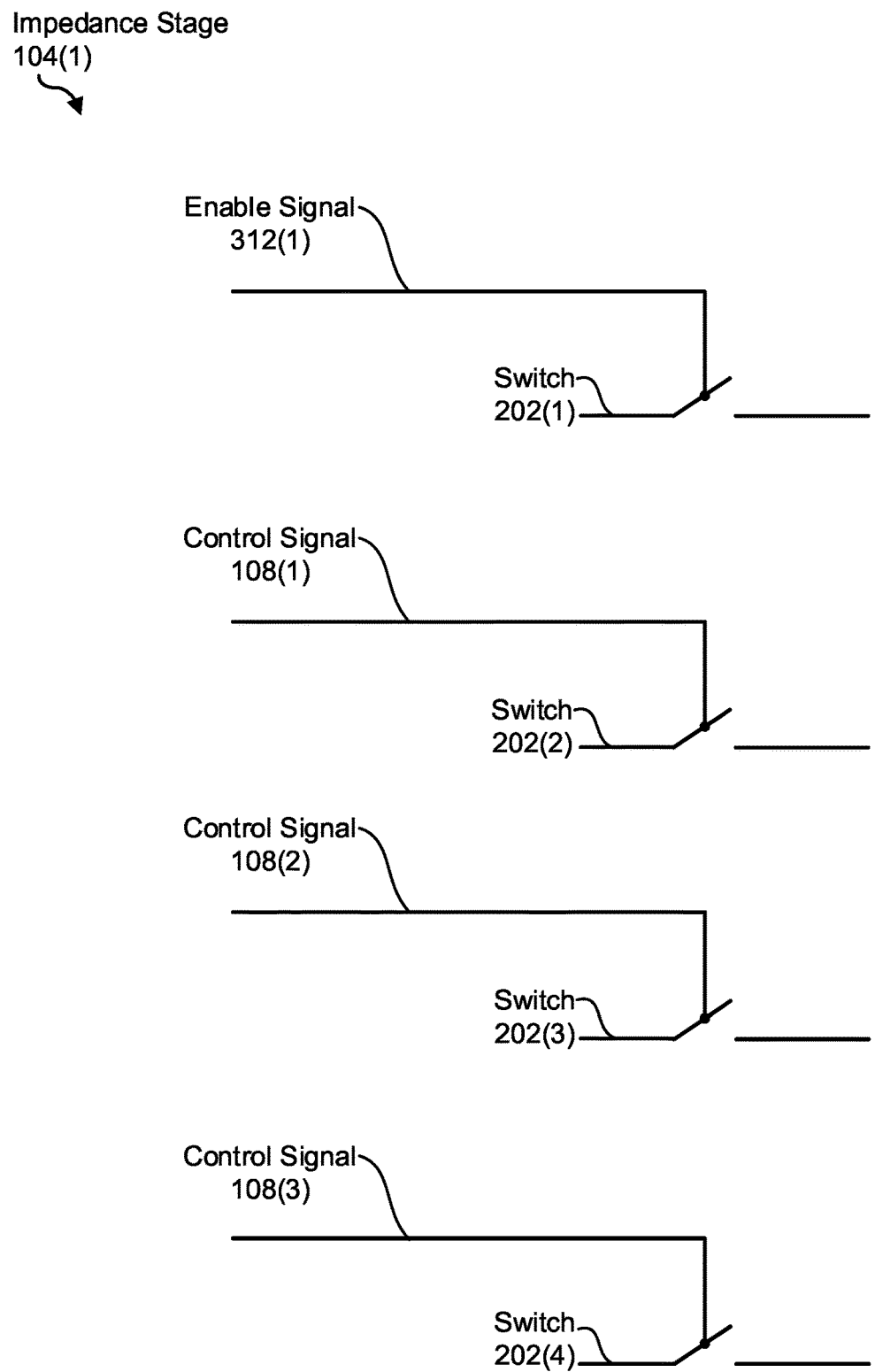
FIG. 3 is a schematic diagram of a portion of the exemplary impedance stage in FIG. 2 according to one or more embodiments of this disclosure.

In some examples, at least some of switches 202(1)-(4) may be enabled, disabled, and/or controlled by group 112(1) of control signals. For example, as illustrated in FIG. 3, switches 202(1)-(4) may be electrically coupled to and/or controlled by an enable signal 312(1), control signal 108(1), control signal 108(2), and control signal 108(3), respectively. In one example, resistors 204(1)-(4) may be arranged in a binary weighted configuration and/or fashion. In this example, control signals 108(1)-(3) may facilitate, support, and/or provide eight different code combinations between "000" and "111" that control the amount of impedance and/or resistance sensed, measured, and/or applied across resistors 204(2)-(4) (e.g., between the CMOS output and equivalent impedance 210). In one implementation, although not illustrated in FIG. 2, the other impedance stages included in impedance-matching driver 102 may constitute and/or represent any similar or identical current mode driver and/or voltage mode driver as the one illustrated in FIG. 2.

In some examples, the amount of resistance applied by impedance stage 104(1) may be represented and/or calculated by the following formula:

$$\frac{1}{R_{Total}} = \frac{1}{R_1} + \frac{1}{R_2} + \ldots + \frac{1}{R_N}.$$

Accordingly, when switches 202(1)-(4) are closed and/or enabled in FIG. 2, the amount of resistance applied by impedance stage 104(1) may be represented and/or calculated by the following formula:

$$\frac{1}{\text{Equivalent Impedance 210}} = \frac{1}{\text{Resistor 204(1)}} + \frac{1}{\text{Resistor 204(2)}} + \frac{1}{\text{Resistor 204(3)}} + \frac{1}{\text{Resistor 204(4)}}.$$

Figure 4:
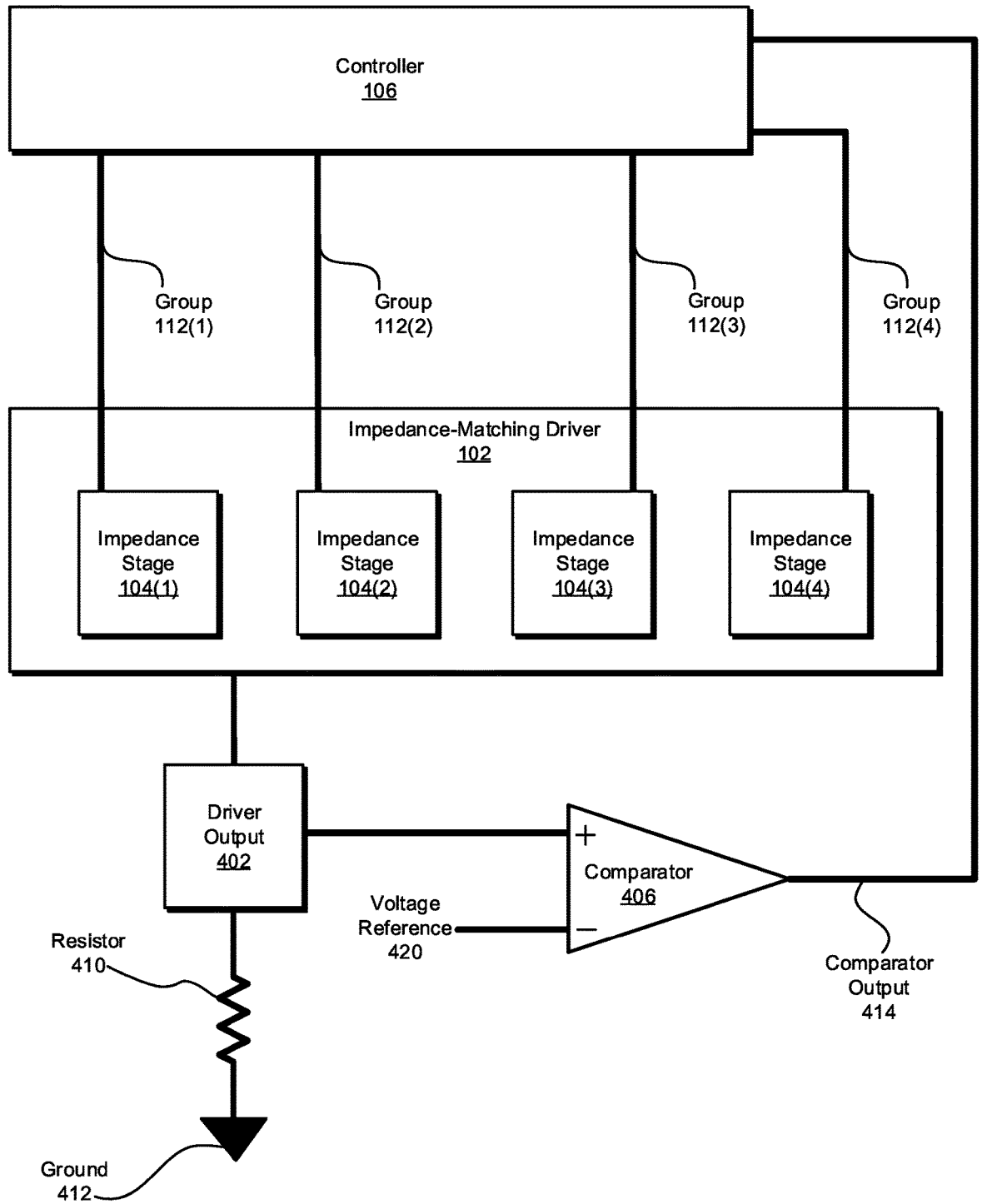
FIG. 4 is a block diagram of an exemplary circuit for calibrating high-speed communication interfaces to transmission lines according to one or more embodiments of this disclosure.

FIG. 4 shows an exemplary circuit 400 that facilitates calibrating high-speed communication interfaces to transmission lines. As illustrated in FIG. 4, circuit 400 may include and/or represent impedance-matching driver 102 and controller 106 communicatively coupled and/or connected to one another via groups 112(1)-(4) of control signals. In some examples, impedance-matching driver 102 may include and/or represent independently controllable impedance stages 104(1)-(4) that facilitate matching the impedance of a transmission line communicatively coupled and/or connected to circuit 400 or a corresponding computing device. In such examples, impedance stages 104(1)-(4) may be communicatively coupled and/or connected to controller 106 via groups 112(1)-(4) of control signals such that controller 106 is able to control and/or program each of impedance stages 104(1)-(4) independently of one another. In one example, impedance-matching driver 102 may enable a computing device to calibrate and/or impedance-match a high-speed communication interface (such as an I/O interface, a transmitter, a receiver, and/or a transceiver) to a corresponding transmission line (such as a cable, a cord, and/or a connector).

In some examples, circuit 400 may also include and/or represent a comparator 406 capable of comparing multiple inputs with one another and then rendering an output indicative of whether one input is greater or less than the other. As an example, comparator 406 may include and/or represent two inputs and a digital output. One input of comparator 406 may be electrically coupled to a driver output 402 of impedance-matching driver 102, and another input of comparator 406 may be electrically coupled to a voltage reference 420. In one example, a resistor 410 may be electrically coupled between driver output 402 and a ground 412. In this example, resistor 410 may provide and/or represent a reference resistance (e.g., 50 ohms) that is targeted by circuit 400 and/or controller 106 during a calibration process and/or cycle. Additionally or alternatively, voltage reference 420 may equal and/or be commensurate to approximately one half of a supply voltage (e.g., VDD).

In some examples, an output 414 of comparator 406 may constitute and/or represent a result of the comparison between the inputs of comparator 406. In one example, when the impedance applied by impedance-matching driver 102 is substantially equal to and/or matches the impedance of the transmission line under test, the voltage represented at driver output 402 may be substantially equal to and/or match voltage reference 420 electrically coupled to the other input of comparator 406. For example, impedance-matching driver 102 and resistor 410 may collectively constitute and/or form a voltage divider that, when the impedance applied by impedance-matching driver 102 is substantially equal to and/or matches the impedance of the transmission line under test, produces and/or renders a voltage at driver output 402 that is commensurate with voltage reference 420 electrically coupled to the other input of comparator 406.

Accordingly, as the amount of impedance applied by impedance-matching driver 102 changes from one side of the impedance of the transmission line to the other (e.g., from below the impedance of the transmission line to above or vice versa), comparator 406 may produce and/or render a state change reflected on comparator output 414. For example, upon reaching a proper impedance match in one configuration and/or calibration cycle, comparator output 414 may change from a low state (e.g., a digital zero) to a high state (e.g., a digital one). In another example, upon reaching a proper impedance match in a different configuration and/or calibration cycle, comparator output 414 may change from a high state (e.g., a digital one) to a low state (e.g., a digital zero). As a result of such state changes, comparator output 414 may indicate, represent, and/or be used to determine whether impedance-matching driver 102 and/or driver output 402 match the impedance of the transmission line under test.

In some examples, controller 106 may communicate and/or transmit different calibration codes to different stages of impedance-matching driver 102 via different groups of control signals at any given moment in time. For example, controller 106 may simultaneously communicate and/or transmit one calibration code to impedance stage 104(1) via group 112(1), another calibration code to impedance stage 104(2) via group 112(2), a further calibration code to impedance stage 104(3) via group 112(3), and/or an additional calibration code to impedance stage 104(4) via group 112(4). In one example, each of those calibration codes simultaneously communicated and/or transmitted to impedance stages 104(1)-(4) may be different and/or unique relative to one another at any given moment in time. In an additional example, some of those simultaneously communicated calibration codes may be different and/or unique relative to one another while others may be the same as one another. In a further example, each of those simultaneously communicated calibration codes may be the same as one another at any given moment in time. Accordingly, and as will be described in greater detail below in connection with FIG. 6, the relative combinations of calibration codes may change, increment, and/or decrement throughout a calibration process and/or cycle.

In some examples, the calibration code communicated and/or sent to impedance stage 104(1) may configure, cause, and/or direct impedance stage 104(1) to apply a certain amount of impedance. In such examples, the calibration codes communicated and/or sent to impedance stages 104 (2)-(4) may configure, cause, and/or direct impedance stage 104(2)-(4) to apply different amounts of impedance relative to one another and/or relative to impedance stage 104(1). The impedances applied by stages 104(1)-(4) may collectively influence, dictate, and/or inform the total impedance output and/or rendered by impedance-matching driver 102.

In one example, controller 106 may enable and/or disable each of impedance stages 104(1)-(4) independently of one another. For example, controller 106 may communicate and/or transmit a command, condition, and/or state to impedance stage 104(1) via enable signal 312(1). In this example, the command, condition, and/or state communicated to impedance stage 104(1) may enable or disable impedance stage 104(1) depending on the resistance desired at any given moment in time. Similarly, controller 106 may communicate and/or transmit the same or different commands, conditions, and/or states to impedance stages 104 (2)-(4) via their respective enable signals to achieve a certain amount of resistance from impedance-matching driver 102 at any given moment in time.

In some examples, controller 106 may detect and/or sense a state change of comparator output 414 (e.g., from a low state to a high state or vice versa). In response to detecting and/or sensing such a state change of comparator output 414, controller 106 may identify the most recent calibration codes communicated and/or transmitted to impedance stages 104 (1)-(4). The most recent calibration codes may have caused impedance-matching driver 102 to apply and/or output the amount of impedance needed to change the state of comparator output 414, thus indicating that those most recent calibration codes represent an accurate impedance match with the transmission line under test. In one example, controller 106 may achieve calibration of a communication interface (such as an I/O interface, a transmitter, a receiver, and/or a transceiver) that incorporates and/or is communicatively coupled to impedance-matching driver 102 by locking in and/or applying those most recent calibration codes to impedance stages 104(1)-(4). Additionally or alternatively, controller 106 may save, record, and/or store those calibration codes in connection with impedance stages 104(1)-(4) for calibration purposes.

In some examples, controller 106 may calibrate one or more communication interfaces to comply with and/or satisfy the high-speed link standards of a corresponding communication protocol (such as PCI, USB, XAUI, MIPI, etc.) based at least in part on the most recent calibration codes that led to the state change on comparator output 414. For example, controller 106 may direct impedance stages 104 (1)-(4) to apply the most recent calibration codes as recorded and/or stored in connection with the state change on comparator output 414 for a corresponding communication interface. Additionally or alternatively, controller 106 may direct similar impedance stages of one or more additional communication interfaces to apply the most recent calibration codes as recorded and/or stored in connection with the state change on comparator output 414. By doing so, controller 106 may be able to match the impedances of such additional communication interfaces to the impedances of corresponding transmission lines that facilitate communication and/or data transfer with other devices and/or components.

Figure 5:
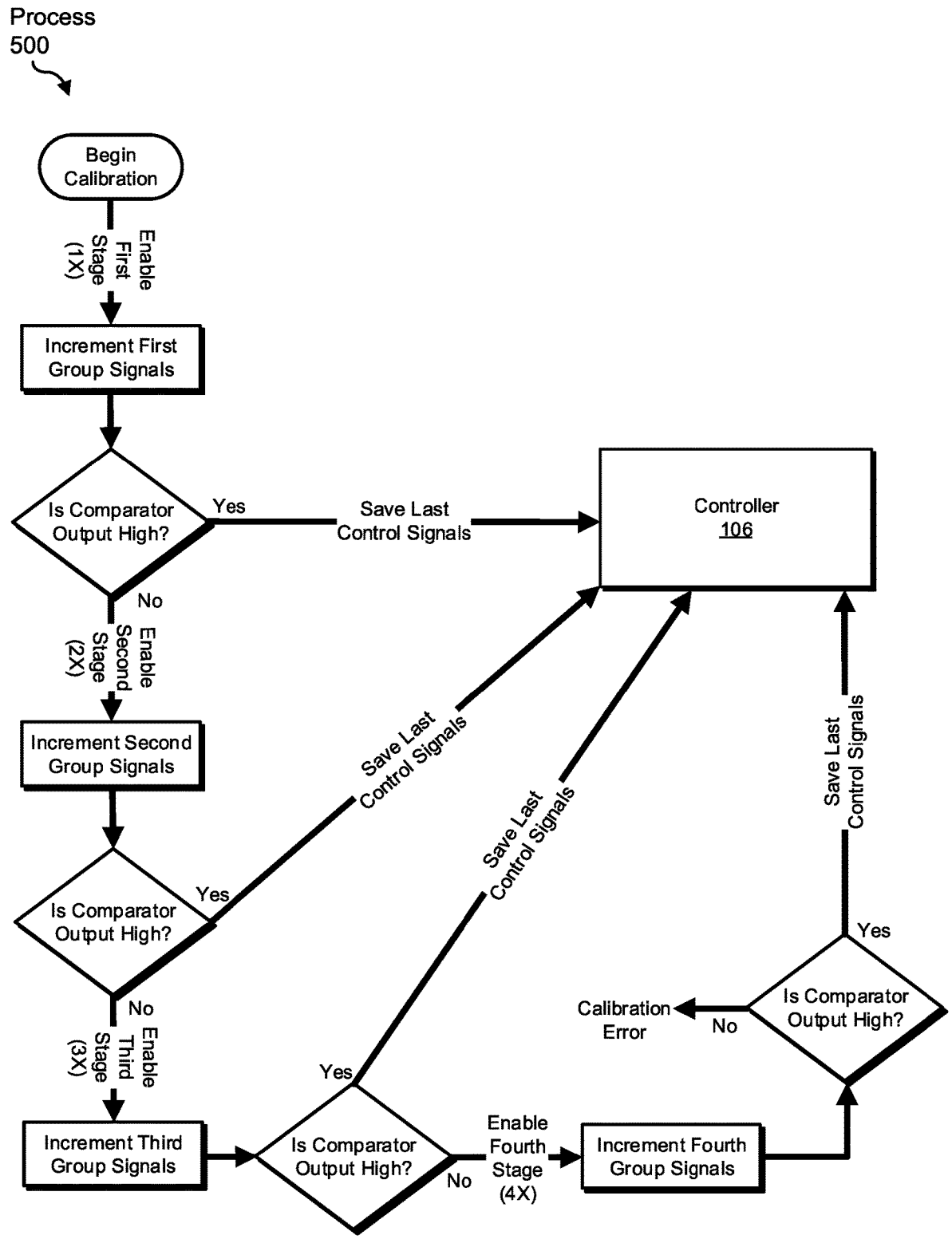
FIG. 5 is a flowchart of an exemplary process for calibrating high-speed communication interfaces to transmission lines according to one or more embodiments of this disclosure.

FIG. 5 shows an exemplary process 500 for calibrating high-speed communication interfaces to transmission lines. In some examples, process 500 in FIG. 5 may begin calibration by having controller 106 enable stage 104(1) of impedance-matching driver 102 (e.g., as configured and/or arranged in FIG. 4). According to process 500, upon enabling stage 104(1), controller 106 may direct and/or cause stage 104(1) to increment and/or decrement the calibration codes represented by group 112(1) of control signals until detecting a state change (e.g., from digital low to digital high) on the output of comparator 406. In one example, if such a stage change occurs while incrementing or decrementing group 112(1) in this way, process 500 may involve controller 106 saving the most recent calibration codes and/or directing or causing impedance-matching driver 102 to lock in those calibration codes. In this example, if no state change occurs while incrementing or decrementing group 112(1) in this way, process 500 may involve controller 106 enabling stage 104(2) and then directing and/or causing stage 104(2) to increment and/or decrement the calibration codes represented by group 112(2) of control signals until detecting a state change (e.g., from digital low to digital high) on the output of comparator 406.

In one example, if such a stage change occurs while incrementing or decrementing group 112(2) in this way, process 500 may involve controller 106 saving the most recent calibration codes and/or directing or causing impedance-matching driver 102 to lock in those calibration codes. In this example, if no state change occurs while incrementing or decrementing group 112(2) in this way, process 500 may involve controller 106 enabling stage 104(3) and then directing and/or causing stage 104(3) to increment and/or decrement the calibration codes represented by group 112(3) of control signals until detecting a state change (e.g., from digital low to digital high) on the output of comparator 406.

In one example, if such a stage change occurs while incrementing or decrementing group 112(3) in this way, process 500 may involve controller 106 saving the most recent calibration codes and/or directing or causing impedance-matching driver 102 to lock in those calibration codes. In this example, if no state change occurs while incrementing or decrementing group 112(3) in this way, process 500 may involve controller 106 enabling stage 104(4) and then directing and/or causing stage 104(4) to increment and/or decrement the calibration codes represented by group 112(4) of control signals until detecting a state change (e.g., from digital low to digital high) on the output of comparator 406.

In one example, if such a stage change occurs while incrementing or decrementing group 112(4) in this way, process 500 may involve controller 106 saving the most recent calibration codes and/or directing or causing impedance-matching driver 102 to lock in those calibration codes. In this example, if no state change occurs while incrementing or decrementing group 112(4) in this way, process 500 may involve controller 106 determining and/or concluding that a calibration error has occurred and/or taken place because the calibration has cycled through all possible code combinations without achieving an impedance match.

FIG. 6 shows an exemplary table 600 that includes and/or contains various rows and/or columns of data representative of a calibration process and/or cycle. In one example, exemplary table 600 may correspond to and/or represent a calibration process and/or cycle applied to circuit 400 in FIG. 4. In this example, resistor 410 in FIG. 4 may provide and/or be configured for 50 ohms of resistance. As a result of resistor 410 providing and/or being configured for 50 ohms of resistance, circuit 400 may be configured to target and/or expect an impedance match upon directing impedance-matching driver 102 to apply and/or output approximately 50 ohms of equivalent resistance across stages 104(1)-(4) during the calibration process and/or cycle.

As illustrated in FIG. 6, exemplary table 600 may include and/or show columns representative of the resolution (step size) of impedance-matching driver 102 during each increment or decrement of the calibration process and/or cycle, the equivalent impedance ($Z_{eq}$) applied and/or output by impedance-matching driver 102 during each increment or decrement of the calibration process and/or cycle, the resistances applied by various weighted impedance stages (5×, 5×, 4×, 4×, 2×, 2×, 1×, and 1×) of impedance-matching driver 102 during each increment or decrement of the calibration process and/or cycle, and/or the combinations of calibration codes applied to groups 112(1)-(4) of control signals during each increment or decrement of the calibration process and/or cycle.

In one example, impedance stage 104(1) may include and/or represent the two 1× weighted slices of impedance-matching driver 102, and impedance stage 104(2) may include and/or represent the two 2× weighted slices of impedance-matching driver 102. Continuing with this example, impedance stage 104(3) may include and/or represent the two 4× weighted slices of impedance-matching driver 102, and impedance stage 104(4) may include and/or represent the two 5× weighted slices of impedance-matching driver 102.

As a specific example with reference to table 600 in FIG. 6, controller 106 may begin the calibration process and/or cycle by communicating calibration codes "000", "000", "000", and "000" to impedance stages 104(1)-(4), respectively, via groups 112(1)-(4) of control signals. In this example, the calibration codes ""000", "000", "000", and "000" may direct and/or cause the two 1×, 2×, 4×, and 5× weighted slices of impedance-matching driver 102 to produce and/or render an equivalent impedance of 62.5 ohms. For example, in response to those calibration codes, each of the 1× weighted slices may apply 1500 ohms, and each of the 2× weighted sliced may apply 750 ohms. Continuing with this example, in response to those calibration codes, each of the 4× weighted slices may apply 375 ohms, and each of the 5× weighted slices may apply 300 ohms. The resulting equivalent impedance of impedance-matching driver 102 may be represented and/or calculated as $$\frac{1}{Z_{eq}} = \frac{1}{1500} + \frac{1}{1500} + \frac{1}{750} + \frac{1}{750} + \frac{1}{375} + \frac{1}{375} + \frac{1}{300} + \frac{1}{300} \text{ or}$$

$$Zeq = \frac{1}{\frac{1}{1500} + \frac{1}{1500} + \frac{1}{750} + \frac{1}{750} + \frac{1}{375} + \frac{1}{375} + \frac{1}{300} + \frac{1}{300}} = 62.5 \text{ ohms.}$$

Further to this example, controller 106 may then communicate incremented calibration codes "000", "000", "000", and "001" to impedance stages 104(1)-(4), respectively, via groups 112(1)-(4) of control signals. In this example, the calibration codes ""000", "000", "000", and "001" may direct and/or cause the two 1×, 2×, 4×, and 5× weighted slices of impedance-matching driver 102 to produce and/or render an equivalent impedance of 61.22 ohms, which constitutes and/or represents a step size of 1.28 ohms from 62.5 ohms. For example, in response to those calibration codes, each of the 1× weighted slices may apply 1200 ohms, and each of the 2× weighted sliced may apply 750 ohms. Continuing with this example, in response to those calibration codes, each of the 4× weighted slices may apply 375 ohms, and each of the 5× weighted slices may apply 300 ohms. The resulting equivalent impedance of impedance-matching driver 102 may be represented and/or calculated as $$\frac{1}{Z_{eq}} = \frac{1}{1200} + \frac{1}{1200} + \frac{1}{750} + \frac{1}{750} + \frac{1}{375} + \frac{1}{375} + \frac{1}{300} + \frac{1}{300} \text{ or}$$

$$Zeq = \frac{1}{\frac{1}{1200} + \frac{1}{1200} + \frac{1}{750} + \frac{1}{750} + \frac{1}{375} + \frac{1}{375} + \frac{1}{300} + \frac{1}{300}} = 61.22 \text{ ohms.}$$

Later in this example, controller 106 may communicate incremented calibration codes "001", "111", "111", and "111" to impedance stages 104(1)-(4), respectively, via groups 112(1)-(4) of control signals. In this example, the calibration codes "001", "111", "111", and "111" may direct and/or cause the two 1×, 2×, 4×, and 5× weighted slices of impedance-matching driver 102 to produce and/or render an equivalent impedance of 29.41 ohms, which constitutes and/or represents a step size of 1.52 ohms from the previous calibration codes. For example, in response to those calibration codes, each of the 1× weighted slices may apply 545.45 ohms, and each of the 2× weighted sliced may apply 272.73 ohms. Continuing with this example, in response to those calibration codes, each of the 4× weighted slices may apply 136.36 ohms, and each of the 5× weighted slices may apply 240 ohms. The resulting equivalent impedance of impedance-matching driver 102 may be represented and/or calculated as $$\frac{1}{Z_{eq}} = \frac{1}{545.45} + \frac{1}{545.45} + \frac{1}{272.73} + \frac{1}{272.73} + \frac{1}{136.36} + \frac{1}{136.36} + \frac{1}{240} + \frac{1}{240}$$

or $$Zeq = \frac{1}{\frac{1}{545.45} + \frac{1}{545.45} + \frac{1}{272.73} + \frac{1}{272.73} + \frac{1}{136.36} + \frac{1}{136.36} + \frac{1}{240} + \frac{1}{240}} = 61.22 \text{ ohms.}$$

Final to this example, controller 106 may communicate incremented calibration codes "111", "111", "111", and "111" to impedance stages 104(1)-(4), respectively, via groups 112(1)-(4) of control signals. In this example, the calibration codes "001", "111", "111", and "111" may direct and/or cause the two 1×, 2×, 4×, and 5× weighted slices of impedance-matching driver 102 to produce and/or render an equivalent impedance of 22.73 ohms, which constitutes and/or represents a step size of 0.89 ohms from the previous calibration codes. For example, in response to those calibration codes, each of the 1× weighted slices may apply 545.45 ohms, and each of the 2× weighted sliced may apply 272.73 ohms. Continuing with this example, in response to those calibration codes, each of the 4× weighted slices may apply 136.36 ohms, and each of the 5× weighted slices may apply 109.09 ohms. The resulting equivalent impedance of impedance-matching driver 102 may be represented and/or calculated as $$\frac{1}{Z_{eq}} = \frac{1}{545.45} + \frac{1}{545.45} + \frac{1}{272.73} + \frac{1}{272.73} + \frac{1}{136.36} + \frac{1}{136.36} + \frac{1}{109.09} + \frac{1}{109.09}$$

or $$Zeq = \frac{1}{\frac{1}{545.45} + \frac{1}{545.45} + \frac{1}{272.73} + \frac{1}{272.73} + \frac{1}{136.36} + \frac{1}{136.36} + \frac{1}{109.09} + \frac{1}{109.09}} = 22.73 \text{ ohms.}$$

As demonstrated by the values shown in table 600 in FIG. 6, impedance-matching driver 102 may be configured and/or designed to change and/or modify its output (e.g., equivalent impedance, $Z_{eq}$, and/or driver output 402) in increments and/or decrements of less than 2.5 ohms. For example, controller 106 may cycle through various calibration codes producing and/or rendering various resolution changes and/or step sizes between 2.39 ohms and 0.89 ohms in impedance-matching driver 102. Accordingly, this configuration and/or design of impedance-matching driver 102 may enable controller 106 to change and/or modify the output of impedance-matching driver 102 in increments and/or decrements of less than 2.0 ohms.

Additionally or alternatively, as demonstrated by the values shown in table 600 in FIG. 6, impedance-matching driver 102 may be configured and/or designed to change and/or modify its output (e.g., equivalent impedance, $Z_{eq}$, and/or driver output 402) across a range of at least 30 ohms. For example, controller 106 may cycle through various calibration codes producing and/or rendering various equivalent impedances between 62.5 ohms and 22.73 ohms in impedance-matching driver 102. Accordingly, this configuration and/or design of impedance-matching driver 102 may enable controller 106 to change and/or modify the output of impedance-matching driver 102 across a range of nearly 40 ohms.

Figure 7:
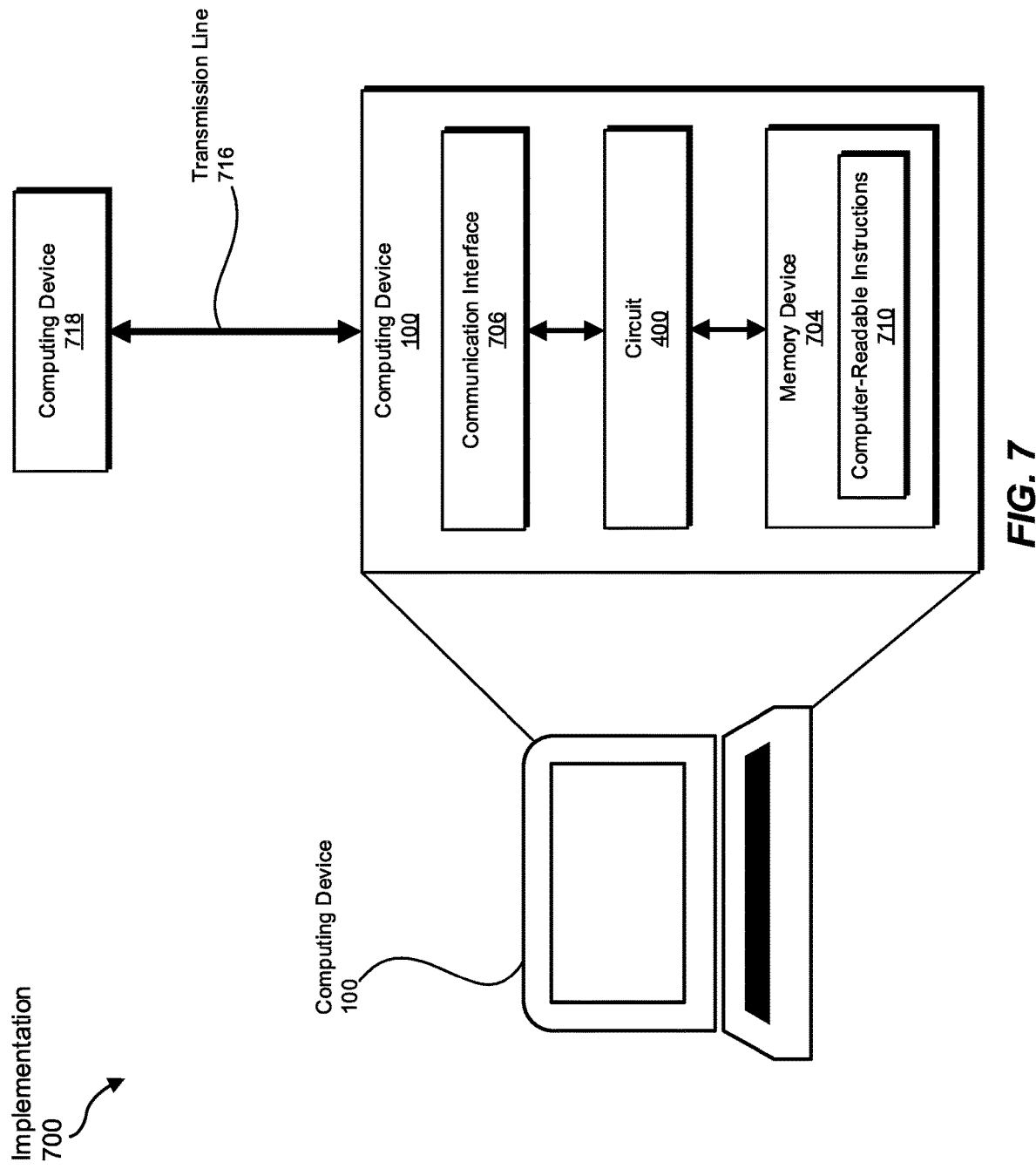
FIG. 7 is a block diagram of an exemplary implementation of a computing device that includes a circuit for calibrating high-speed communication interfaces to transmission lines according to one or more embodiments of this disclosure.

FIG. 7 illustrates an exemplary implementation 700 involving computing device 100. As illustrated in FIG. 7, computing device 100 may include and/or represent circuit 400 communicatively coupled to a memory device 704 and a communication interface 706. In some examples, memory device 704 may maintain and/or store one or more computer-readable instructions 610. Additionally or alternatively, although FIG. 7 illustrates memory device 704 and communication interface 706 as being external to computing device 100, memory device 704 and/or communication interface 706 may alternatively represent part of and/or be included within circuit 400. In other embodiments, memory device 704 and/or communication interface 706 may constitute and/or represent components and/or devices that are separate or distinct from circuit 400.

In some examples, communication interface 706 may include and/or represent an I/O interface, a transmitter, a receiver, and/or a transceiver. Additionally or alternatively, transmission line 716 may include and/or represent to a cable, a cord, and/or a connector that facilitates and/or supports communication between computing devices 100 and 718. In one embodiment, transmission line 716 and computing device 718 may constitute and/or represent a single unit, device, component, and/or system. In another embodiment, transmission line 716 and computing device 718 may constitute and/or represent distinct units, devices, components, and/or systems.

In some examples, memory device 704 may include and/or represent any type or form of volatile or non-volatile storage device or medium capable of storing data (e.g., the calibration codes that render an impedance match) and/or computer-readable instructions. Examples of memory device 704 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, and/or any other suitable memory device.

In one example, computing device 100 may be communicatively coupled to a computing device 718 via a transmission line 716. To achieve improved performance and/or reliability of a communication link established between computing devices 100 and 718 via transmission line 716, computing device 100 may calibrate communication interface 706 to match the impedance of transmission line 716. In one example, computing device 100 may do so by determining an impedance match between communication interface 706 and transmission line 716 or computing device 718 based at least in part on a calibration process and/or cycle performed by circuit 400 and then modifying the impedance of communication interface 706 to match the impedance of transmission line 716 and/or computing device 718. By doing so, computing device 100 may be able to adapt communication interface 706 to any of a variety of different high-speed communication protocols and/or standards depending on the type or form of device and/or transmission line that is installed and/or connected to communication interface 706.

Figure 8:
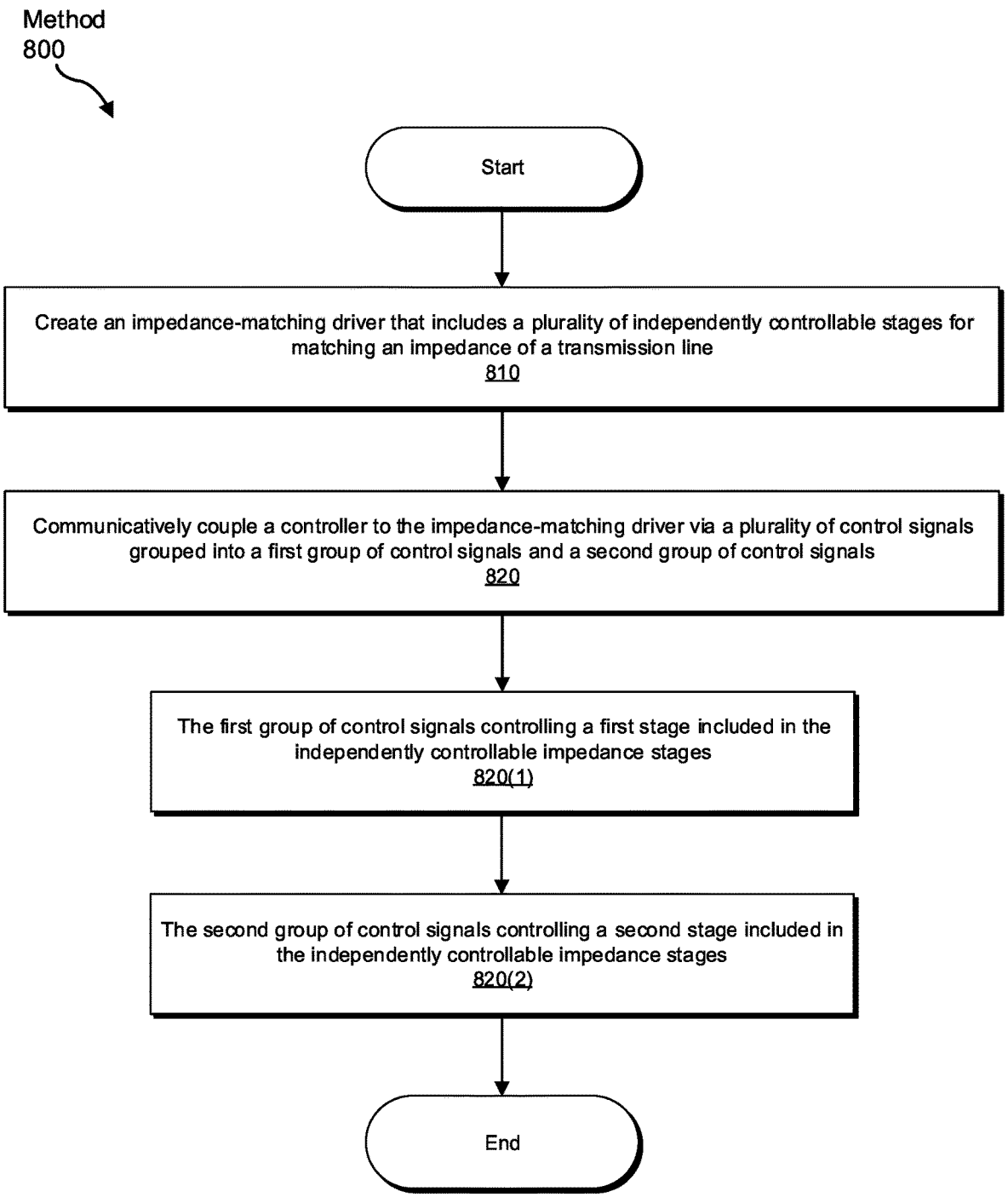
FIG. 8 is a flowchart of an exemplary method for calibrating high-speed communication interfaces to transmission lines according to one or more embodiments of this disclosure.

FIG. 8 is a flow diagram of an exemplary method 800 for calibrating high-speed communication interfaces to transmission lines. In one example, the steps shown in FIG. 8 may be performed during a fabrication, manufacturing, and/or assembly process. Additionally or alternatively, the steps shown in FIG. 8 may also incorporate and/or involve various sub-steps and/or variations consistent with the descriptions provided above in connection with FIGS. 1-7.

As illustrated in FIG. 8, method 800 may include and/or involve the step of creating an impedance-matching driver that includes a plurality of independently controllable stages for matching an impedance of a transmission line (810). Step 810 may be performed in a variety of ways, including any of those described above in connection with FIGS. 1-7. For example, a computing and/or telecommunications equipment manufacturer may create, manufacture, and/or assemble an impedance-matching driver that includes a plurality of independently controllable stages for determining and/or matching the impedance of a transmission line.

Method 800 may also include the step of communicatively coupling a controller to the impedance-matching driver via a plurality of control signals grouped into a first group of control signals and a second group of control signals (820). Step 820 may be performed in a variety of ways, including any of those described above in connection with FIGS. 1-7. For example, the computing and/or telecommunications equipment manufacturer may communicatively couple a controller to the impedance-matching driver via a plurality of control signals grouped into a first group of control signals and a second group of control signals. In this example, the first group of control signals may be configured and/or communicatively coupled to enable the controller to control a first stage included in the independently controllable impedance stages (820(1)). Additionally or alternatively, the second group of control signals may be configured and/or communicatively coupled to enable the controller to control a second stage included in the independently controllable impedance stages (820(2)).

As described above in connection with FIGS. 1-8, the calibration of receiver and/or transmitter I/O impedances may be important for achieving high-speed link standards like PCI, USB, XAUI, etc. As the interface speeds increase, it may be important to match the impedances of I/O drivers with transmission lines to avoid signal reflections on those transmission lines. Such calibration may necessitate precise impedance matching across process, voltage, and temperature (PVT) variations, including wide impedance range support with a finer step size than those of conventional calibration technologies. To achieve a wider impedance range with finer resolution, some conventional calibration circuits may provide more switches for testing the variable impedance network, which potentially leads to higher PAD output capacitances at the transmitter end. Unfortunately, such higher output capacitances may be unsuitable for high-speed applications (e.g., above 10 gigabits per second) and/or may lead to large increases in power. An improved calibration circuit may be able to achieve wider impedance ranges with finer step resolution without increasing PAD output capacitances and/or power. This improved calibration circuit may effectively reduce the resolution of the step size from 10 ohms to 1.5 ohms while, at the same time, achieving impedance ranges of 30 to 40 ohms from the nominal value of 50 ohms.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The apparatuses, systems, and methods described herein may employ any number of software, firmware, and/or hardware configurations. For example, one or more of the exemplary embodiments and/or implementations disclosed herein may be encoded as a computer program (also referred to as computer software, software applications, computer-readable instructions, and/or computer control logic) on a computer-readable medium. In one example, when executed by at least one processor, the encodings of the computer-readable medium may cause the processor to generate and/or produce a computer-readable representation of an integrated circuit configured to do, perform, and/or execute any of the tasks, features, and/or actions described herein in connection with FIGS. 1-8. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and/or other distribution systems.

In addition, one or more of the modules, instructions, and/or micro-operations described herein may transform data, physical devices, and/or representations of physical devices from one form to another. Additionally or alternatively, one or more of the modules, instructions, and/or micro-operations described herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computing device comprising:
   an impedance-matching driver that includes a plurality of independently controllable impedance stages that facilitate matching an impedance of a transmission line;
   a controller communicatively coupled to the impedance-matching driver via a plurality of control signals grouped into:
      a first group of control signals that control a first stage included in the independently controllable impedance stages; and
      a second group of control signals that control a second stage included in the independently controllable impedance stages; and
   a comparator that includes:
      an input electrically coupled to an output of the impedance-matching driver;
      an additional input electrically coupled to a voltage reference; and
      a digital output whose state change indicates whether the output of the impedance-matching driver matches the impedance of the transmission line.

2. The computing device of claim 1, wherein:
the first group of control signals is capable of communicating a first calibration code to the first stage of the impedance-matching driver at a given moment in time; and
the second group of control signals is capable of communicating a second calibration code to the second stage of the impedance-matching driver at the given moment in time.

3. The computing device of claim 2, wherein:
the first calibration code configures the first stage of the impedance-matching driver to apply a certain amount of impedance; and
the second calibration code configures the second stage of the impedance-matching driver to apply a different amount of impedance.

4. The computing device of claim 3, wherein the controller is capable of enabling the first stage of the impedance-matching driver independently of the second stage of the impedance-matching driver.

5. The computing device of claim 1, wherein the controller:
detects the state change of the digital output of the comparator; and
in response to detecting the state change of the digital output:
identifies a most recent calibration code communicated to the first stage of the impedance-matching driver;
identifies an additional most recent calibration code communicated to the second stage of the impedance-matching driver; and
records the most recent calibration code and the additional most recent calibration code.

6. The computing device of claim 5, wherein the controller calibrates a communication interface to match the impedance of the transmission line by:
directing the first stage of the impedance-matching driver to apply the most recent calibration code; and
directing the second stage of the impedance-matching driver to apply the additional most recent calibration code.

7. The computing device of claim 6, wherein the communication interface is adaptable to at least two of:
a Peripheral Component Interconnect (PCI) protocol;
a Universal Serial Bus (USB) protocol;
an X Attachment Unit Interface (XAUI) protocol; or
a Mobile Industry Processor Interface (MIPI) protocol.

8. The computing device of claim 1, wherein:
the first stage of the impedance-matching driver comprises a first enable signal and a first set of resistors connected in parallel with each other; and
the second stage of the impedance-matching driver comprises a second enable signal and a second set of resistors connected in parallel with each other.

9. The computing device of claim 1, wherein the impedance-matching driver is configured to enable the controller to modify an impedance of an output in increments or decrements of less than two ohms.

10. The computing device of claim 9, wherein the impedance-matching driver is configured to enable the controller to modify the impedance of the output across a window range of at least 30 ohms.

11. The computing device of claim 1, wherein the plurality of control signals are further grouped into a third group of control signals that control a third stage included in the independently controllable impedance stages.

12. The computing device of claim 1, wherein the computing device consists of a circuit.

13. The computing device of claim 1, wherein the computing device comprises at least one circuit that includes:
the impedance-matching driver;
the controller; and
a memory device communicatively coupled to the controller.

14. A computing device comprising:
an impedance-matching driver that includes a plurality of independently controllable impedance stages that facilitate matching an impedance of a transmission line; and
a controller communicatively coupled to the impedance-matching driver via a plurality of control signals grouped into:
a first group of control signals that control a first stage included in the independently controllable impedance stages, the first stage of the impedance-matching driver comprising a first enable signal and a first set of resistors connected in parallel with each other; and
a second group of control signals that control a second stage included in the independently controllable impedance stages, the second stage of the impedance-matching driver comprises a second enable signal and a second set of resistors connected in parallel with each other.

15. The computing device of claim 14, wherein:
the first group of control signals is capable of communicating a first calibration code to the first stage of the impedance-matching driver at a given moment in time; and
the second group of control signals is capable of communicating a second calibration code to the second stage of the impedance-matching driver at the given moment in time.

16. The computing device of claim 15, wherein:
the first calibration code configures the first stage of the impedance-matching driver to apply a certain amount of impedance; and
the second calibration code configures the second stage of the impedance-matching driver to apply a different amount of impedance.

17. The computing device of claim 16, wherein the controller is capable of enabling the first stage of the impedance-matching driver independently of the second stage of the impedance-matching driver.

18. A computing device comprising:
an impedance-matching driver that includes a plurality of independently controllable impedance stages that facilitate matching an impedance of a transmission line; and
a controller communicatively coupled to the impedance-matching driver via a plurality of control signals grouped into:
a first group of control signals that control a first stage included in the independently controllable impedance stages; and
a second group of control signals that control a second stage included in the independently controllable impedance stages;
wherein the impedance-matching driver is configured to enable the controller to modify an impedance of an output in increments or decrements of less than two ohms.

19. The computing device of claim 18, wherein the impedance-matching driver is configured to enable the controller to modify the impedance of the output across a range of at least 30 ohms.

20. The computing device of claim 18, wherein the plurality of control signals are further grouped into a third group of control signals that control a third stage included in the independently controllable impedance stages.

* * * * *